(12) United States Patent
Enicks et al.

(10) Patent No.: US 9,561,982 B2
(45) Date of Patent: Feb. 7, 2017

(54) METHOD OF CLEANING GLASS SUBSTRATES

(71) Applicant: Corning Incorporated, Corning, NY (US)

(72) Inventors: Darwin Gene Enicks, Corning, NY (US); Yoshihiro Nakamura, Shizuoka (JP); Siva Venkatachalam, Painted Post, NY (US); Wanda Janina Walczak, Big Flats, NY (US); Liming Wang, Painted Post, NY (US)

(73) Assignee: CORNING INCORPORATED, Corning, NY (US)

(*) Notice: Subject to any disclaimer, the term of this patent is extended or adjusted under 35 U.S.C. 154(b) by 313 days.

(21) Appl. No.: 14/244,570

(22) Filed: Apr. 3, 2014

(65) Prior Publication Data

US 2014/0318578 A1  Oct. 30, 2014

Related U.S. Application Data

(60) Provisional application No. 61/817,532, filed on Apr. 30, 2013.

(51) Int. Cl.
| | |
|---|---|
| *C03C 23/00* | (2006.01) |
| *B08B 3/12* | (2006.01) |
| *B08B 3/08* | (2006.01) |
| *H01L 21/02* | (2006.01) |
| *B08B 11/04* | (2006.01) |

(52) U.S. Cl.
CPC ............ *C03C 23/0075* (2013.01); *B08B 3/08* (2013.01); *B08B 3/12* (2013.01); *B08B 11/04* (2013.01); *H01L 21/02041* (2013.01)

(58) Field of Classification Search
CPC ............ C23G 1/00; C23G 1/02; C03C 23/00; C03C 23/0075; H01L 21/00; H01L 21/02019; H01L 21/02041; B08B 11/04
USPC .... 134/2, 3, 26, 28, 29; 252/79.1, 79.3, 79.5
See application file for complete search history.

(56) References Cited

U.S. PATENT DOCUMENTS

| | | | |
|---|---|---|---|
| 5,985,700 A | 11/1999 | Moore | 438/149 |
| 6,194,365 B1* | 2/2001 | Lee | C03C 15/00 134/2 |
| 6,230,720 B1* | 5/2001 | Yalamanchili | H01L 21/02052 134/1.3 |
| 7,896,970 B2 | 3/2011 | Tomita et al. | 134/4.3 |

(Continued)

FOREIGN PATENT DOCUMENTS

| | | |
|---|---|---|
| EP | 2177487 B1 | 8/2007 |
| EP | 2434004 A1 | 5/2009 |

(Continued)

OTHER PUBLICATIONS

PCT Notification of transmittal of the international Search Report and the written opinion of the international searching authority—Dated Sep. 2, 2014, PCT/US14/35771.

(Continued)

*Primary Examiner* — Saeed T Chaudhry
(74) *Attorney, Agent, or Firm* — Kevin M. Able (57) ABSTRACT

A method of cleaning thin glass substrates comprises applying a sequence of chemical washing steps as the thin glass substrate is being conveyed in a conveyance direction. In addition, surfaces of the glass substrate may be treated to enhance electrostatic discharge properties of the glass substrates.

20 Claims, 3 Drawing Sheets

(56) References Cited

U.S. PATENT DOCUMENTS

| | | | |
|---|---|---|---|
| 2002/0011079 A1 | 1/2002 | Fujioka | 65/61 |
| 2003/0192348 A1 | 10/2003 | Kudoh et al. | |
| 2004/0000324 A1* | 1/2004 | Masui | B08B 3/08 134/3 |
| 2004/0053806 A1 | 3/2004 | Kenmochi et al. | 510/438 |
| 2005/0016958 A1* | 1/2005 | Tan | C23C 16/4407 216/83 |
| 2005/0241667 A1 | 11/2005 | Bodet et al. | |
| 2007/0012335 A1 | 1/2007 | Chang et al. | 134/1 |
| 2007/0157668 A1 | 7/2007 | Nadaud et al. | 65/60.1 |
| 2010/0288311 A1 | 11/2010 | Kholodenko et al. | 134/26 |
| 2010/0319735 A1* | 12/2010 | Hidaka | C11D 3/3947 134/34 |
| 2011/0155169 A1 | 6/2011 | Holsteyns et al. | 134/1.3 |
| 2011/0272625 A1* | 11/2011 | Wijekoon | H01L 21/30608 252/79.5 |
| 2011/0722625 | 11/2011 | Wijekoon et al. | |
| 2012/0058258 A1 | 3/2012 | Ye et al. | 427/127 |
| 2012/0065116 A1 | 3/2012 | Miyashita et al. | 510/175 |
| 2012/0129344 A1 | 5/2012 | Treichel et al. | 438/690 |

FOREIGN PATENT DOCUMENTS

| | | |
|---|---|---|
| JP | 4482844 | 6/2010 |
| JP | 4519234 B2 | 8/2010 |
| WO | 2011/080629 A2 | 7/2011 |

OTHER PUBLICATIONS

Reinhardt et al.; "Handbook of Silicon Wafer Cleaning Technology Second Edition"; Copyright 2008 by William Andrew Inc.; p. 34 and p. 430.

* cited by examiner

METHOD OF CLEANING GLASS SUBSTRATES

PRIORITY

This application claims the benefit of priority under 35 U.S.C. §119 of U.S. Provisional Application Ser. No. 61/817,532 filed on Apr. 30, 2013, the content of which is relied upon and incorporated herein by reference in its entirety.

BACKGROUND

Field

This invention generally relates to cleaning of glass articles, and in particular glass substrates used in the manufacture of high performance display panels.

Technical Background

As the line widths of thin film transistors on glass substrates become thinner, technology that removes submicron sized particles effectively so that the transistor is not interrupted by the existence of these contaminants are increasingly in demand. The same can be said for the color filter industry, as contaminants are known to adversely affect black matrix adhesion and resulting RGB pixel integrity. For example, for the color filter industry it is known that black matrix peeling events occur more frequently with narrower line widths. Current industry information indicates the frequency of peeling events are about 2.8% for 19 μm black matrix line widths and 0.3% for 27 um line widths. It is expected these frequencies will increase with decreasing line width. For thin film transistors, it is further expected that this trend will be the same, and removal of increasingly smaller particulate contaminants will become more important. Nevertheless, no industry standard exists for the display glass industry for submicron particle removal, unlike that which exists for the semiconductor industry.

SUMMARY

Currently, the flat panel industry primarily utilizes detergent as the chemical cleaning agent, coupled with one or more mechanical methods, e.g. ultrasonics, megasonics, brushes, sprays etc., to clean glass. The types of detergent vary and may include such commercial products as Semiclean KG, Parker 225×, or the like. These detergents may be bases or acids, and may include chelators, surfactants, and other proprietary (and therefore unknown) components. As detergents are known to leave behind residues that can interfere with black matrix adhesion or result in higher concentrations of mobile ions that are detrimental to thin film transistor (TFT) devices, improved cleaning solutions are needed that eliminate annoying residue problems or higher mobile ion concentrations. In addition, existing cleaning process steps are not optimized to remove different defect types (organic, adhered glass or metallic) or varying particle size (submicron, micron or larger). Moreover, as various processing steps may re-introduce contaminants, the ability to perform the cleaning process generally at single location in the process timeline, for example as a sequence of consecutive steps, can result in a glass substrate being substantially free of the major contaminants, including organic, metallic and particulate contaminants.

Disclosed herein is a cleaning process for a glass substrate such that a pristine surface (low particle density for particles having an effective diameter greater than about 0.3 micron sizes, low levels of metallic contaminants and having improved electrostatic performance) is produced. The method is a chemically driven and mechanically assisted process using multiple cleaning solutions combined with large size LCD substrate cleaning and handling processes. The process utilizes an approach wherein particles of progressively smaller effective diameter are removed from a surface of the glass substrate by applying an in-line sequential treatment to the surface.

The process can be applied to any glass composition (aluminosilicates, soda lime etc.), thickness (e.g. less than about 3 mm) and size (up to and including 3.2 meters×3.6 meters). The process may include reducing or completely removing various types of defects on or at the surface (e.g. within about 5 nm of the surface) of the glass substrate such as glass particles, metallic contamination, organic contamination etc. It can also remove defects having sizes ranging from about 0.3 μm to about 200 μm using a combination of chemical and mechanical methods. The process optimizes the glass surface chemistry and physical properties of the glass, such as roughness, to ensure superior performance during downstream processes, including deposition processes for oxide TFT, LTPS, and organic light emitting diodes (OLEDs). An exemplary process sequence can be described according to the following sequence of steps and in reference to FIG. 1.

Figure 1:
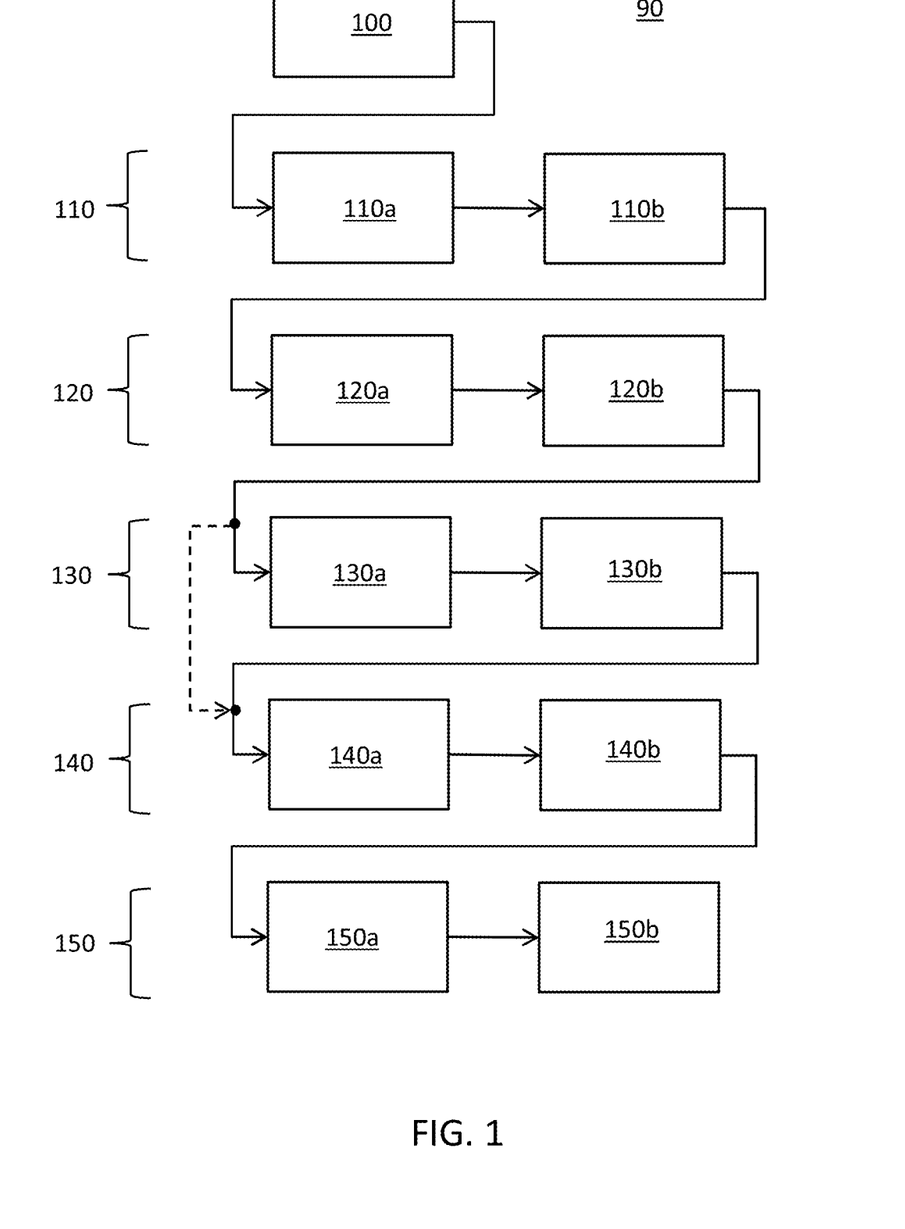
FIG. 1 is a diagrammatic depiction of a process for cleaning a glass substrate product in accordance with an embodiment of the present disclosure.

In accordance with the process sequence illustrated in FIG. 1, in a first pre-clean step 100, a high pressure liquid discharge (e.g. deionized water) may be used to remove large and loose particles disposed on a surface of the glass substrate. Ozonated water can be added to the liquid discharge if an organic layer exists on at least a portion of one or both major surfaces of the glass substrate. Alternatively, a detergent may be employed with or without water, as a substitute for water, or before or after the use of water in step 100.

In a second step 110, large glass particles (>1 μm) and organic contamination are removed with a first base solution, for example an SC1 solution ($NH_4OH+H_2O_2+H_2O$). Ultrasonic agitation of the first base solution can be used to provide a mechanical assist action. The mechanical assist can also be via brushes, either used independently or in combination with ultrasonic agitation of the first base solution.

In a third step 120, submicron particle removal (e.g. particles having an effective diameter in a range from about 0.3 to about 1.0 μm) is performed with a second base solution, such as an SC1, administered as a high pressure liquid discharge, and wherein particle removal may be optionally assisted by megasonic agitation of the second base solution.

In an optional fourth step 130, surface treatment for better electro static discharge (ESD) characteristics of the glass substrate is performed. In this step the glass substrate is exposed to the liquid discharge of an acid solution, for example an acid solution comprising hydrofluoric acid (HF), to increase a roughness of the glass substrate surface to which the acid solution is applied.

In a fifth step 140, metallic contamination removal is achieved using a dilute hydrochloric acid (HCl) solution. Megasonic agitation may optionally be applied to the solution.

In a sixth step 150, the glass substrate is dried with a gas discharge knife system and the surface of the glass substrate is conditioned for inspection and packaging. As used herein, a gas discharge knife system refers to a gas discharge system wherein a gas is discharged from a narrow slot or slit in a discharge head at high velocity. The gas may be, for example air, although any suitable inert gas may be employed, including without limitation nitrogen, argon, krypton, helium, neon and combinations thereof. Nitrogen is a cost effective alternative to air if air cannot be used for any reason. The glass substrate may optionally be treated with an ESD ionizer to neutralize static charge.

The above process sequence can provide a pristine surface on a glass substrate that may then be subsequently inspected, packaged and shipped to customers, or, if the process is performed in a facility where additional processing may occur, such as the deposition of the aforementioned layers, the glass substrate may move to additional stations for further processing.

Accordingly, disclosed herein is an in-line method of removing contaminants from a surface of a glass substrate comprising the steps of conveying the glass substrate with a conveying device along a conveyance direction, wherein during the conveying at least one surface of the glass substrate is subjected to a surface treatment comprising, sequentially: a) exposing the at least one surface of the glass substrate to a liquid discharge comprising ozonated water; b) exposing the at least one surface of the glass substrate to a liquid discharge of a first base solution; c) exposing the at least one surface of the glass substrate to a liquid discharge of a second base solution; d) exposing the at least one surface of the glass substrate to a liquid discharge of a first acid solution to remove metallic ions from the at least one surface of the glass substrate, wherein the first acid solution comprises HCl; and e) drying the at least one surface of the glass substrate. The method may further comprise exposing the glass substrate to a liquid discharge of a second acid solution after step c) but before step e).

In some embodiments the second acid solution comprises HF. In other embodiments the second acid solution comprises an ammonium bifluoride solution having a molar concentration in a range from about 0.2 M to about 2 M.

An average surface roughness Ra of the glass substrate after step e) may be in a range from equal to or greater than about 0.2 nm to about 0.8 nm.

The first base solution may, for example, comprise $NH_4OH:H_2O_2:H_2O$ having a mixture ratio in a range from about 1:1:5 to about 1:2:200 by volume, and be at a temperature in a range from about 40° C. to about 80° C. The glass substrate can be exposed to the first base solution for a time in a range from about 1 minute to about 30 minutes. A pH of the first base solution is typically greater than about 10.

The method may further comprise applying ultrasonic energy to the first base solution at a frequency in a range from about 20 kHz to about 200 kHz.

The method may further comprise applying megasonic energy to the second base solution at a frequency in a range from about 850 kHz to about 1.2 MHz.

The glass substrate typically comprises less than $1.6 \times 10^{12}$ atoms/cm$^2$ of Na, K, Fe, Cu and Zn within 5 nm of the at least one surface after step e).

The at least one surface of the glass substrate typically comprises less than 0.02 particles/cm$^2$ having an effective diameter greater than 0.3 microns after step e).

In another embodiment an in-line method of removing contaminants from a surface of a glass substrate comprising the steps of conveying the glass substrate with a conveying device along a conveyance direction, wherein during the conveying at least one surface of the glass substrate is subjected to a surface treatment comprising, sequentially: a) exposing the at least one surface of the glass substrate to a liquid discharge comprising ozonated water; b) exposing the at least one surface of the glass substrate to a liquid discharge of a first base solution; c) exposing the at least one surface of the glass substrate to a liquid discharge of a second base solution; d) exposing the at least one surface of the glass substrate to a liquid discharge of a first acid solution to remove metallic ions from the at least one surface of the glass substrate, wherein the first acid solution comprises HCl; e) drying the at least one surface of the glass substrate; and wherein the glass substrate is exposed to a liquid discharge of a second acid solution prior to step e).

The liquid discharge of the second acid solution may be performed before or after step c).

The second acid solution may comprise HF, or, alternatively, the second acid solution may comprise an ammonium bifluoride solution having a molar concentration in a range from about 0.2 M to about 2 M.

The glass substrate typically comprises less than $1.6 \times 10^{12}$ atoms/cm$^2$ of Na, K, Fe, Cu and Zn within 10 nm of the at least one surface after step e).

The at least one surface of the glass substrate typically comprises less than 0.02 particles/cm$^2$ having an effective diameter greater than 0.3 microns after step e).

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention and together with the description serve to explain the principles and operation of the invention.

DETAILED DESCRIPTION

Reference will now be made in detail to exemplary embodiments of the present disclosure, examples of which are illustrated in the accompanying drawings. Wherever possible, the same reference numbers will be used throughout the drawings to refer to the same or like parts.

An exemplary process for manufacturing a glass substrate, and in particular a thin glass substrate suitable for the manufacture of liquid crystal or other type displays, can involve the following steps: (i) forming a thin ribbon of glass, (ii) cutting the thin ribbon of glass into individual glass substrates (iii) removing areas of non-uniform thickness, e.g. "beads", that may have developed along the edges of the thin glass ribbon during the forming process, (iv)

sizing the glass substrate to required dimensions, (v) peeling of any protective film that may have been attached to the glass substrate, such as for ease in handling, (vi) grinding & polishing edge portions of the glass substrate, such as edge portions remaining from the removal of areas of non-uniform thickness, (vii) washing the glass substrate, (viii) inspection of the glass substrate, and (ix) packaging. Each step has a bearing on the type, size and nature of contamination that may be found on the glass substrate. Although measures are taken to prevent and control contamination throughout the manufacturing process, it is the cleaning step that is expected to remove all of the contamination the glass substrate may have accumulated during manufacturing and to provide a surface quality to the glass substrate that meets or exceeds customer expectations. Accordingly, a method of cleaning a glass substrate is disclosed herein that can be used to remove both organic and inorganic contamination from glass substrates. In addition, the cleaning process described herein can be beneficial in removing unwanted ions in a surface layer of the glass substrate that may interfere with the operation of electronic components subsequently deposited on the glass substrate. Such ions may include ions that form a portion of the glass composition.

Glass substrates that may benefit from the methods described herein can have a thickness in a range from about 100 μm to about 3 mm, for example in a range from about 100 μm to about 1 mm, or from about 100 μm to about 500 μm. However, in some embodiments the thickness of the glass substrate can be thinner than about 100 μm, for example in a range from about 50 μm to about 100 μm. The glass substrate may be a flat glass sheet having substantially parallel major surfaces. An area of one major surface of the glass sheet may be in a range from less than 1 square meter ($m^2$) to about 12 square meters. However, the methods described herein can be particularly useful for glass substrates having a single surface area (length times width of the glass substrate) equal to or greater than 4 square meters, for example, in a range from about 4 square meters to about 12 square meters. It should be understood that the methods disclosed herein are not limited by the size of the glass substrate. The glass substrate may be formed by any suitable method for producing sheets of glass, including without limitation float processes, up-draw and down-draw processes, and slot draw processes, which processes are well-known in the art and will not be described further herein.

Glass substrates resulting from the methods described herein may be used in any number of downstream processes, but are particularly well-suited for use in the manufacturing of electronic devices. For example, glass substrates resulting from the methods described herein may be used in the manufacture of visual display panels as may be used for liquid crystal displays (LCD) or light emitting diode (e.g. organic light emitting diode, OLED) displays. Such visual display panels may be used in a variety of electronic devices, including without limitation mobile communication devices (e.g. cell phones), portable computers (e.g. tablets, notebook computers and laptop computers), desktop computers, televisions, and even large-format displays that may cover all or a portion of a wall.

Figure 2:
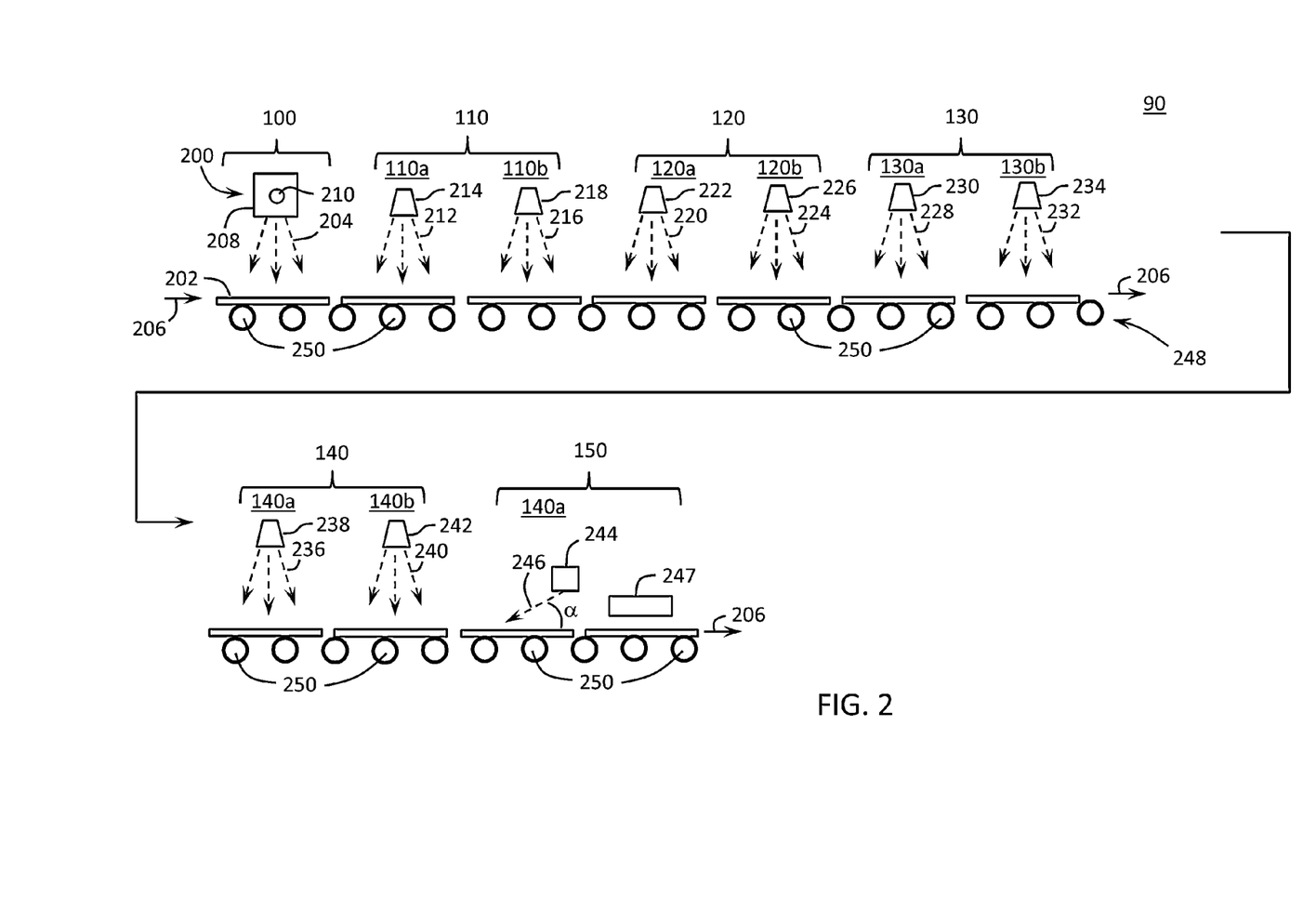
FIG. 2 is an elevational schematic drawing of the process of FIG. 1.
Figure 3:
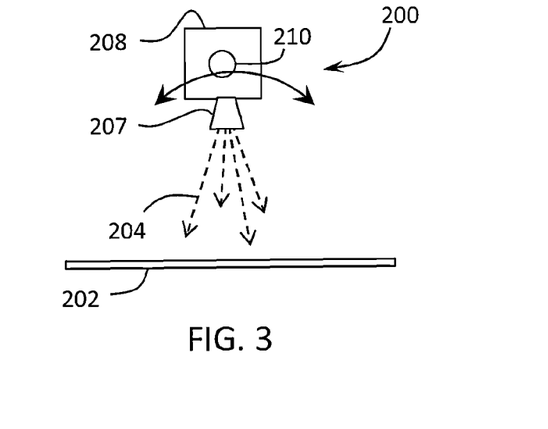
FIG. 3 is a schematic drawing of a moving liquid discharge device for applying a liquid to a surface of the glass substrate according to an embodiment described herein.

The following steps, illustrated in FIGS. 1 and 2, describe an exemplary process 90 for cleaning a glass substrate in accordance with the present disclosure. In a first step 100, large particles (having a size greater than about 1 μm) and organic contamination can be removed with a cleaning liquid using a moving liquid discharge device 200. The primary function of moving liquid discharge device 200 is to remove large glass particles from the surface of the glass substrate 202 with the force generated by the cleaning liquid 204 impinging against the surface of the glass substrate. FIG. 2 depicts a plurality of glass substrates 202 being conveyed in process 90 in a conveyance direction 206. Often, such large glass particles are the result of previous cutting processes, where large glass substrates are cut into smaller glass substrates. Referring to FIG. 3, the force may be imparted to the cleaning liquid spray both by a nozzle 207 that increases the flow velocity of the water and the mechanical swing action imparted to a nozzle bar 208 that includes the nozzle. The mechanical swing action may be imparted to the nozzle bar, for example, by a motor and levers, gears, drive chains, etc., (not shown) that provide a reciprocating angular motion to the nozzle bar so that the nozzle bar rotates about an axis 210. For example, nozzle bar 208 may swing through an arc of about ±5 degrees to about ±90 degrees relative to a normal to the plane of the glass substrate, from about ±10 degrees to about ±80 degrees, or from about ±15 degrees to about ±60 degrees. In some embodiments the cleaning liquid 204 can be water, for example deionized water. The moving liquid discharge device 200 can also use ozonated deionized water as the cleaning liquid 204, which helps in removing organic contamination. The oxidation potential for ozonated deionized water ($DIO_3$) is high, so organic material disposed on a surface of the glass substrate is converted into $CO_2$, $H_2O$, etc. As used herein, $DIO_3$ represents deionized (DI) water comprising ozone (i.e. ozonated water), for example where ozone has been bubbled through the DI water prior to use. In some embodiments, a detergent may be used in combination with water (e.g. DI water or $DIO_3$), and may be used either before the water, after the water, or simultaneously with the water. In other embodiments, detergent may be substituted for the water.

Referring back to FIGS. 1 and 2, while moving liquid discharge device 200 represents a mechanical means of removing large particles by brute force, in a second step generally referred to as step 110 in FIGS. 1 and 2, a chemical solution may be used to lift particles from the surface of the glass substrate in sub-step 110a. In accordance with some embodiments, the glass substrate may be exposed to a first base solution 212, such as an SC1 solution. SC1 is a high pH (>10) solution of $NH_4OH$ and $H_2O_2$ (ammonium hydroxide and hydrogen peroxide) in water (($NH_4OH$: $H_2O_2$:$H_2O$). Ultrasonic agitation can be employed with the first base solution to assist in lifting particles from the surface of the glass substrate. For example, an ultrasonic transducer can be affixed to a nozzle 214 arranged above or below the glass substrate, and wherein the ultrasonic transducer is used to induce ultrasonic energy (i.e. vibrations) into the first base solution as it exits the nozzle. A suitable frequency range for the ultrasonic energy can be in the range from about 20 kHz to about 200 kHz. More than one nozzle 214 may be used to discharge first base solution 212.

Particle removal, especially the removal of adhered glass particulate, is enhanced by performing an undercutting action where the applied chemical solution slightly etches the boundary between the glass surface and the particle. The undercutting action aids in breaking Van der Waals forces between the glass substrate surface and the particulate, and lifts particles off the glass surface, after which the particles need to be moved away from the glass substrate to avoid re-deposition (recontamination). If the first base solution comprises SC1, the mixture ratio of the SC1 solution can range from between about 1:1:5 to about 1:2:80 by volume (e.g., 1 part $NH_4OH$ to 1 part $H_2O_2$ to 5 parts $H_2O$ by volume). For example, suitable mixture ratios within the foregoing range include without limitation 1:1:5, 1:2:20, 1:2:40, and 1:2:80, 1:2:200 or any range therebetween. Accordingly, suitable ranges may include a range between about 1:1:5 and about 1:2:40, between about 1:1:5 and about 1:2:40, and between about 1:2:20 and about 1:2:80. For example, a mixture ratio of about 1:2:40 has been shown to be particularly effective for particle removal. The exposure time of the first base solution on the glass substrate surface can be varied depending on the size and number of adhered glass particles. A typical exposure time may fall within a range from about 1 min to about 30 min. The presence of hydrogen peroxide may also provide an oxidation potential that can aid in the removal of organic contamination (usually effective for the removal of light contamination by organic materials). A temperature of the first base solution 212 may be in a range from about 25° C. to about 80° C., for example, from about 40° C. to about 75° C. Mechanical assistance, such as brushes (not shown), can be used in combination with the first base solution to scrub the surface of the glass substrate.

In a second sub-step 110b to step 110, the glass substrate can be rinsed with a suitable rinsing liquid 216 applied to the glass substrate from nozzle 218 as a liquid discharge to ensure that particles lifted from the surface of the glass substrate in sub-step 110a are removed away from the surface of the glass substrate to prevent re-deposition of the particles onto the surface of the glass substrate. Rinsing liquid 216 can be deionized water.

Still referring to FIGS. 1 and 2, in a third step, designated generally as step 120, submicron-sized particles less than about 1 µm in size are removed. To effectively remove submicron-sized particles, the boundary layer between the submicron-sized particles and the glass substrate must be reduced. This is achieved by exposing the surface of the glass substrate to a liquid discharge of a second base solution 220 from a nozzle 222 as represented by first sub-step 120a. The liquid discharge may optionally be combined with megasonic agitation of the second base solution. For example, a suitable second base solution may comprise SC1. If the second base solution comprises SC1, the mixture ratio of the SC1 solution can range from about 1:1:5 to about 1:2:80 by volume (e.g. 1 part $NH_4OH$ to 1 part $H_2O_2$ to 5 parts $H_2O$ by volume). For example, suitable mixture ratios within the foregoing range include without limitation 1:1:5, 1:2:20, 1:2:40, 1:2:80, 1:2:200 or any range therebetween. Accordingly, suitable mixture ratio ranges may include a range from about 1:1:5 to about 1:2:40, from about 1:1:5 to about 1:2:40, and from about 1:2:20 to about 1:2:80. The megasonic agitation may be provided, for example, by using a piezoelectric crystal array transducer (not shown) coupled with nozzle 222, where electrical energy is converted into mechanical energy by the transducer and transmitted by the transducer-coupled spray nozzle to the second base solution 220. This energy transfers through the second base solution to the glass substrate as acoustic waves with a frequency in a range from about 850 kHz to about 1.2 MHz. The liquid discharge of the second base solution can be performed, for example, by means of a curtain or shower of the liquid solution directed by nozzle 222 against one or both surfaces of the glass substrate 202. The liquid discharge may be performed under pressure, for example.

In a second sub-step 120b to step 120, a deionized water rinse 224 can be employed as a liquid discharge from nozzle 226 to remove any remaining traces of the second base solution on the treated surfaces of the glass substrate. The deionized water rinse can also be beneficial in removing loosened particles away from the glass substrate surface.

In an optional fourth step, designated generally as step 130, a surface of the glass substrate may be treated to produce a desired electro static discharge (ESD) characteristic. The treatment may be applied to one or both surfaces of the glass substrate, depending on end user requirements. During downstream processing of glass substrates by original equipment manufacturers (OEMs), such as the deposition of thin film transistors, the glass substrate will usually be held to a support surface. If the glass substrate and/or support surface builds up an electrostatic charge during further processing, electrical shorts between components of a deposited thin film transistor may occur that are harmful to the transistor. An accumulated electrostatic charge may also make it difficult to remove the glass substrate from the support surface without damage. Electrostatic charge is particularly problematic for very thin glass substrates, e.g. glass substrates less than a millimeter in thickness, as difficulty removing the thin glass substrate from the support may result in breakage of the thin glass substrate. Texturing or reducing the contact area of the glass surface that will be adjacent to the support surface decreases electrostatic charging events during contact, conveyance, handling, and separation of the glass substrate, while, additionally, improving customer transfer equipment life-time by lowering the coefficient of friction between materials and extending wear resistance. Electrostatic charging on a surface of a flat panel display glass substrate that is supported by the support surface also creates issues on the opposite surface, such as transistor gate damage via electrostatic discharge dielectric breakdown. The more charge accumulated at a surface, the higher the surface voltage. An electrostatic charge can also attract particles that contaminate the surface, which in turn causes lower yields during the TFT-LCD manufacturing process.

To mitigate difficulties associates with ESD, a surface of the glass substrate that will be supported by a support surface can optionally be treated to increase a surface roughness of the glass substrate, thereby reducing contact between the glass substrate and the support surface and electrostatic charging of these surfaces. A glass substrate as treated herein may include a side having a surface roughness of about 0.2 nm, or even about 0.15 nm for a 2×2 µm atomic-force microscope (AFM) scan, and another side having a surface roughness of from about 0.3 nm to about 1.3 nm. For example, an average surface roughness (Ra) greater than 0.2 nm is attainable using the methods described herein, and in most instances between 0.2 nm and 0.8 nm can be achieved. Ra is calculated as:

$$R_a = \sqrt{\left(\frac{1}{n}\sum_{i=1}^{n} |Z_i - \overline{Z}|\right)} \quad (1)$$

where n is the number of points at which measurement occurs, Z is the height at each point and Zbar is the average height collected at each point in the line scan. Ra is often designated as "average" surface roughness.

To prepare the surface to have desired ESD properties a first acid solution 228 comprising hydrofluoric acid (HF), and/or other acids, may be applied through nozzle 230 during an optional sub-step 130a. The glass sheet may be treated with a treatment solution to modify the ESD performance of the glass sheet. In some embodiments, the treatment solution may be hydrochloric acid (HCl). The molarity (M, moles/liter) of the HCl may be from about 0.15 M to about 0.35 M, or even from about 0.2 M to about 0.3 M, for example about 0.25 M. In some embodiments, the treatment solution may be a mixture of sulfuric acid ($H_2SO_4$) and water. In some embodiments, the sulfuric acid:water mixture may be a 1:4 mixture ratio, or even a 1:3 mixture ratio. In other embodiments, the mixture of sulfuric acid and water may be a 1:2 mixture ratio. In some embodiments, the treatment solution may be a dilute mixture of sodium fluoride (NaF) and phosphoric acid ($H_3PO_4$). An exemplary mixture of NaF and $H_3PO_4$ may be a mixture of 0.2 moles/liter NaF and 1 mole/liter $H_3PO_4$, which may be diluted in water in a 4:5 mixture. In yet other embodiments, the treatment solution may be a mixture of HCl and hydrofluoric acid (HF). In these embodiments, the molarity of the HCl may be from about 0.15 M to about 0.35 M, or even from about 0.2 M to about 0.3 M. HF may be added to the HCl in concentrations from about $1 \times 10^{-3}$ M to about 1 M, or even from about $2 \times 10^{-3}$ M to about $1 \times 10^{-4}$ M. In some embodiments $2.5 \times 10^{-3}$ M of HF may be added to HCl. It should be understood that other formulations of the treatment solution may be possible. For example, other suitable acids include $HNO_3$, ammonium bifluoride, ammonium fluoride, HF:$NH_4F$, HF:$NH_4HF$ mixtures, or others. Ammonium bifluoride ($NH_4HF_2$) may be used to reduce the amount of metallic ions that must be removed from the glass substrate in later steps, as $NH_4HF_2$ does not include sodium. The foregoing acids may be diluted with water, e.g. DI water. The application of HF may be done, for example, by mixing two chemical compounds that produce HF upon reaction. In some instances the mixture of these two acids may contain metal ions. For example, NaF and $H_3PO_4$ can be mixed to form HF, such as for example, 0.35 moles/liter NaF and 1 mole/liter $H_3PO_4$. Alternatively, an aqueous solution of ammonium bifluoride having a molarity from about 0.2 M to about 2 M can be used.

The effect of an acid treatment with the first acid solution results in a roughening of the glass substrate surface to which the acid is applied. The level of roughening depends on the composition of the glass, concentration of the chemical ingredients, time of exposure, temperature etc., and may be adjusted as necessary by varying any of the foregoing parameters, such as the concentration of the first acid solution. Exemplary exposure times can range from about 1 minute to about 60 minutes, with a temperature of the first acid solution in a range from about 25° C. to about 90° C., for example from about 40° C. to about 65° C.

In a second sub-step 130b to step 130, a deionized water rinse 232 can be applied from a nozzle 234 after the ESD treatment to ensure there is no residue of the acid solution. In addition, the de-ionized water rinse can remove any particles or precipitates that may have formed on the surface of the glass substrate. In some embodiments, step 130 may be switched with step 120 so that surface treatment for ESD is performed prior to treatment with the second base solution for submicron particle removal.

In a fifth step 140, metallic contamination is removed from one or both surfaces of the glass substrate. In accordance with a first sub-step 140a, the glass substrate may be exposed to a second acid solution 236 comprising dilute HCl. An aqueous HCl solution having a mixture ratio in a range from about 1:20 to about 1:200 (HCL:DI water) may be used. Examples of suitable mixture ratios, without limitation, can be from about 1:20 to about 1:80, from about 1:200 to about 1:80, from about 1:80 to about 1:200, from about 1:80 to about 1:120 or from about 1:80 to about 1:140. The second acid treatment may be performed with a liquid discharge from a nozzle 238, and the second acid solution may be agitated with megasonic energy in a manner as previously described. The second acid solution can, for example, be sprayed on one or both surfaces of the glass substrate to initiate a reaction (redox reaction) with any metallic contamination, such as metallic particulate. A temperature of the second acid solution can be in a range from about 25° C. to about 80° C.

In some embodiments, an SC2 solution (HCl:$H_2O_2$:$H_2O$) may be used in conjunction with, or as a substitute for, a dilute HCl solution.

To illustrate the effectiveness of exposure of a glass substrate to a dilute HCl solution, in one example a surface of a glass substrate (Corning Incorporated Lotus glass) was cleaned with Semiclean KG detergent, rinsed and then dried (Before Surface Treatment). The substrate surface was subsequently treated by exposing the surface to a solution of HCl diluted in DI water at a ratio (HCl:DI water) of 1:200 by volume at a temperature of 65° C. for 5 minutes (After Surface Treatment). The results in Table 1 describe the total count for ions of the indicated elements in units of atoms/$cm^2$, and wherein ND indicates "not detectable". The surface was characterized via drop scan etch inductively coupled plasma mass spectroscopy.

TABLE 1

| Element | Before Surface Treatment | After Surface Treatment |
|---|---|---|
| Aluminum (AL) | 3.20E+14 | 1.1E+13 |
| Calcium (Ca) | 3.50E+13 | 1.50E+13 |
| Chromium (Cr) | ND | ND |
| Cobalt (Co) | 1.20E+10 | ND |
| Copper (Cu) | 4.00E+10 | 6.00E+10 |
| Iron (Fe) | 1.30E+12 | 3.20E+11 |
| Lithium (Li) | ND | ND |
| Magnesium (Mg) | 1.20E+13 | 4.50E+12 |
| Manganese (Mn) | 3.00E+10 | ND |
| Molybdenum (Mo) | ND | ND |
| Nickel (Ni) | ND | ND |
| Potassium (K) | 5.70E+12 | 1.60E+13 |
| Sodium (Na) | 1.10E+13 | 3.40E+13 |
| Vanadium (V) | * | * |
| Zinc (Zn) | 2.20E+11 | 2.00E+11 |
| Total Concentration | 3.80E+14 | 8.10E+13 |

A second experiment was also conducted on samples of Corning Lotus glass using a number of different conditions, and the results for concentrations of five metal ions—sodium, potassium, iron, copper and zinc—are presented in Table 2. Ion concentrations are presented in atoms/$cm^2$ (in standard engineering notation, where, for example, E+12 is equal to $1 \times 10^{12}$). All samples were treated in an aqueous solution of dilute hydrochloric acid (dHCl). Baseline (before treatment) data are given for three samples (S3, S6 and S9) as indicated by the suffix "Ba". The column for Side indicates the opposing major surfaces of the glass substrate samples, designated either as Side A or Side B. Baseline samples were washed in DI water at ambient temperature for 4 minutes. Conditions for the treated samples are given in Table 3. In Table 3, the mixture ratio is the ratio of HCl to DI water, by volume, the temperature is the temperature of the acid solution, and the time the glass substrate was exposed to the acid solution. As indicated, the maximum post-treatment concentration of the five metal ions is $15.1 \times 10^{11}$ atoms/$cm^2$ (S4, Side B).

TABLE 2

| | Side | Na | K | Fe | CU | Zn |
|---|---|---|---|---|---|---|
| S3-Ba | A | 8.3E+12 | 7.1E+12 | 1.1E+12 | 9.8E+09 | 1.1E+10 |
| | B | 8.4E+12 | 8.7E+12 | 1.0E+12 | <8E+09 | 1.0E+10 |
| S6-Ba | A | 9.4E+12 | 8.4E+12 | 1.2E+12 | 9.4E+09 | 1.2E+10 |
| | B | 9.9E+12 | 1.0E+13 | 1.1E+12 | <8E+09 | 9.8E+09 |
| S9-Ba | A | 8.7E+12 | 7.7E+12 | 1.6E+12 | 8.4E+09 | 1.0E+10 |
| | B | 9.8E+12 | 1.0E+13 | 1.6E+12 | <8E+09 | 3.0E+10 |
| S1 | A | 6E+11 | 7.7E+11 | 5.9E+10 | <8E+09 | <8E+09 |
| | B | 7.4E+11 | 1.1E+11 | 1.4E+11 | <8E+09 | 1.1E+10 |
| S2 | A | 1.1E+12 | 1.6E+11 | 7.8E+10 | <8E+09 | <8E+09 |
| | B | 8.3E+11 | 1.4E+11 | 5.9E+10 | <8E+09 | <8E+09 |
| S3 | A | 1.6E+12 | 3.6E+11 | 8.6E+10 | <8E+09 | <8E+09 |
| | B | 1.7E+12 | 5.3E+11 | 1.1E+11 | <8E+09 | <8E+09 |
| S4 | A | 2.5E+12 | 9.3E+11 | 1.3E+11 | <8E+09 | <8E+09 |
| | B | 3.0E+12 | 1.1E+12 | 1.5E+11 | <8E+09 | 2.6E+11 |
| S5 | A | 6.6E+11 | 9.8E+10 | 3.9E+10 | <8E+09 | <8E+09 |
| | B | 6.5E+11 | 1.3E+11 | 4.7E+10 | <8E+09 | 1.1E+10 |
| S6 | A | 1.0E+12 | 2.3E+11 | 5.6E+10 | <8E+09 | <8E+09 |
| | B | 1.0E+12 | 2.4E+11 | 6.3E+10 | <8E+09 | 1.2E+10 |
| S7 | A | 1.6E+12 | 2.7E+11 | 8.8E+10 | <8E+09 | 9.9E+09 |
| | B | 1.5E+12 | 3.5E+11 | 8.3E+10 | <8E+09 | 1.7E+10 |
| S8 | A | 1.9E+12 | 5.1E+11 | 9.6E+10 | <8E+09 | 9.9E+09 |
| | B | 2.2E+12 | 7.0E+11 | 1.1E+11 | <8E+09 | <8E+09 |

TABLE 3

| | Acid | Concentration | Temp. | Time |
|---|---|---|---|---|
| S1 | dHCl | 1:20 | 65° C. | 2 min. |
| S2 | dHCl | 1:20 | 65° C. | 4 min. |
| S3 | dHCl | 1:200 | 40° C. | 2 min. |
| S4 | dHCl | 1:200 | 40° C. | 4 min. |
| S5 | dHCl | 1:200 | 65° C. | 2 min. |
| S6 | dHCl | 1:200 | 65° C. | 4 min. |
| S7 | dHCl | 1:20 | 40° C. | 2 min. |
| S8 | dHCl | 1:20 | 40° C. | 4 min. |

Figure 4:
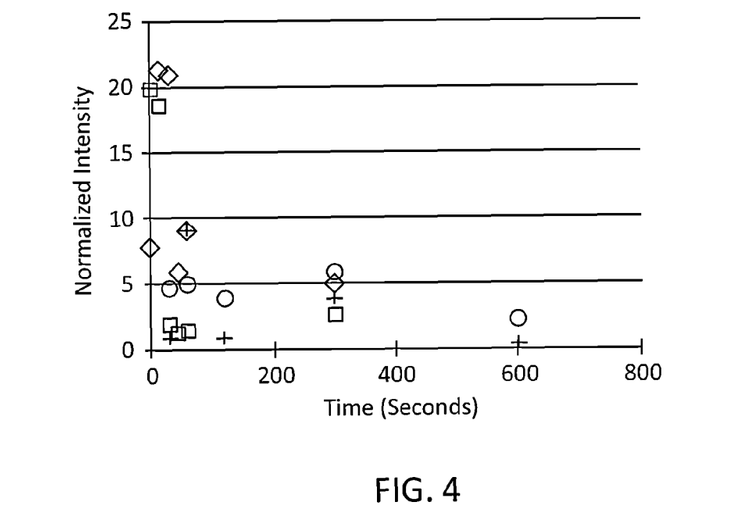
FIG. 4 is a plot showing the normalized intensity of sodium and potassium ions at the surface of a glass substrate as a function of time during after exposure to a aqueous HCl solution.

Referring to FIG. 4, a plot is shown depicting the normalized intensity of several species of alkali metal ions (sodium and potassium) at the surface of a glass substrate, as measured by time-of-flight secondary ion mass spectroscopy (TOF-SIMS), as a function of time when exposed to different concentrations of an aqueous HCl solution. Data are shown for normalized sodium intensity when the glass substrate is exposed to an HCl:H$_2$O solution at a concentration of 1:200 (diamond symbol) and 1:80 (circle symbol), and the normalized potassium intensity when the glass substrate is exposed to a HCl:H$_2$O solution at a concentration of 1:200 (square symbol) and 1:80 (plus symbol). The data show that the amount of alkali metal at the surface of the glass substrate decreases rapidly for both concentrations of HCl, and both alkali metals, with an approximate 400% drop in intensity over a span of only 100 seconds.

In accordance with embodiments disclosed herein, the second acid solution can be maintained at a temperature in a range from about 50° C. to about 80° C., and in some embodiments in a range from about 60° C. to about 70° C. An exposure time of the glass substrate to the second acid solution can be in a range from about 0 minutes to about 10 minutes, for example in a range from about 30 seconds to about 5 minutes or in a range from about 30 seconds to about 10 minutes.

In a second sub-step 140b to step 140 a deionized water rinse 240 can be applied from a nozzle 242. This final rinse can be in the form of a high pressure liquid discharge to provide a thorough rinse of the glass substrate surfaces and remove any contaminants and/or chemical residue in preparation for a drying step, described next.

In a sixth step 150, the surfaces of the glass substrate are dried by a gas knife device 244 that produces a gas discharge, configured as a thin, elongated stream of gas 246, that is directed at the glass substrate 202 at an angle α relative to a surface of the glass substrate, for an angle from about 30 degrees to about 60 degrees, in a first sub-step 150a. The gas directed against the surface of the glass substrate drives off any water remaining from a final rinse step. Optionally, in a second sub-step 150b to step 150, one or both surfaces of the glass substrate may be treated with an ESD ionizer 247 to neutralize any accumulated static charge on the surface of the glass substrate.

Using the methods described herein, a glass substrate having a surface particle density less than 0.02 particles per cm$^2$ can be achieved for particles having a size equal to or greater than about 0.3 microns. Moreover, using the methods described herein, a metallic content of a surface layer of the glass substrate less than 10 nm in thickness can be equal to or less than $1 \times 10^{10}$ atoms/cm$^2$.

As earlier described and as shown in FIG. 2, the process described above may be implemented in an "in-line" process wherein the glass substrate to be treated is conveyed continuously by a conveyance device 248 and the various preceding steps are performed in a sequential manner as the glass substrate travels in a conveyance direction 206. For example, in one embodiment shown in FIG. 2, the conveyance device 248 may comprise a plurality of rollers 250 that move the glass sheet along the conveyance direction 206.

Figure 5:
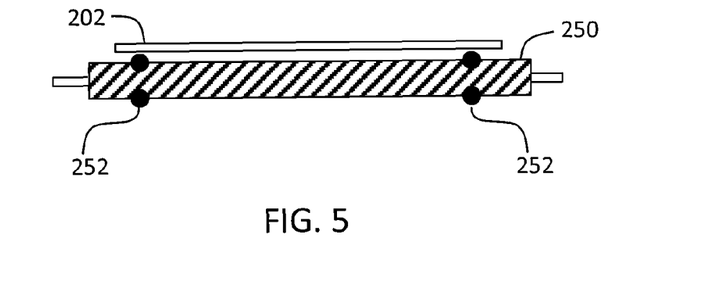
FIG. 5 is a cross sectional view of a portion of a conveying device used to convey a glass substrate through the process of FIGS. 1 and 2.

As depicted in FIG. 5 showing a cross sectional view of a typical roller 250 where the direction of conveyance is perpendicular to the paper, the roller 250 may comprise resilient contact surfaces 252 that contact the glass substrate 202 while minimizing marring of the contacted surface of the glass substrate. For example, contact surfaces 252 may comprise "O-rings" formed from a suitable rubber-like material. The O-rings may be positioned within grooves formed in the rollers that prevent the O-rings from moving on the surface of the rollers. Such O-rings typically have a circular cross sectional shape, and therefore produce a line contact with a surface of the glass sheet. The rollers may include both driven rollers and non-driven rollers, wherein the driven rollers are coupled to a power source (not shown) that imparts rotational motion to the rollers. Such rotation exhibited by the driven rollers moves the glass substrate along the conveyance direction 206. On the other hand, non-driven rollers freely rotate, and serve primarily to support the glass substrate as the glass substrate is moved along the conveyance direction by the driven rollers. In the present embodiment, the glass substrate would be conveyed in a generally horizontal orientation. Other method of conveyance may also be employed. For example, the glass substrate may be conveyed in a substantially vertical orientation.

In still another embodiment, the conveyance apparatus may comprise one or more "air bearings" of a type that levitate the glass sheet on a cushion of gas, such as air. Such air bearings may be arranged such that the glass sheet is conveyed in a horizontal orientation, or at an angle relative to a horizontal plane. However, the use of air bearings impedes access to both sides of the glass sheet, thereby limiting the ability to apply the preceding process to both sides of the glass sheet simultaneously. Other forms of conveyance as are known in the art may also be employed, including without limitation open link belts that provide access to both surfaces of the glass substrate.

It will be apparent to those skilled in the art that various modifications and variations can be made to the present invention without departing from the scope of the invention. Thus, it is intended that the present invention cover the modifications and variations of this invention provided they come within the scope of the appended claims and their equivalents.

What is claimed is:

1. An in-line method of removing contaminants from a surface of a glass substrate comprising the steps of:
conveying the glass substrate with a conveying device along a conveyance direction, wherein during the conveying at least one surface of the glass substrate is subjected to a surface treatment comprising, sequentially:
a) exposing the at least one surface of the glass substrate to a liquid discharge comprising ozonated water;
b) exposing the at least one surface of the glass substrate to a liquid discharge of a first base solution, wherein ultrasonic energy is applied to the first base solution at a frequency in a range from about 20 kHz to about 200 kHz;
c) exposing the at least one surface of the glass substrate to a liquid discharge of a second base solution;
d) exposing the at least one surface of the glass substrate to a liquid discharge of a first acid solution to remove metallic ions from the at least one surface of the glass substrate, wherein the first acid solution comprises HCl; and
e) drying the at least one surface of the glass substrate.

2. The method according to claim 1, further comprising increasing an average surface roughness of the glass substrate by exposing the glass substrate to a liquid discharge of a second acid solution after step d).

3. The method according to claim 2, wherein the second acid solution comprises HF.

4. The method according to claim 2, wherein the second acid solution comprises an ammonium bifluoride solution having a molar concentration in a range from about 0.2 M to about 2 M.

5. The method according to claim 2, wherein the average surface roughness Ra of the glass substrate after increasing the average surface roughness of the glass substrate is in a range from equal to or greater than about 0.2 nm to about 0.8 nm.

6. The method according to claim 1, wherein the first base solution comprises $NH_4OH:H_2O_2:H_2O$ having a mixture ratio in a range from about 1:1:5 to about 1:2:80 by volume.

7. The method according to claim 1, wherein the first base solution is at a temperature in a range from about 40° C. to about 80° C. and the glass substrate is exposed to the first base solution for a time in a range from about 1 minute to about 30 minutes.

8. The method according to claim 1, wherein a pH of the first base solution is greater than about 10.

9. The method according to claim 1, further comprising applying megasonic energy to the second base solution at a frequency in a range from about 850 kHz to about 1.2 MHz.

10. The method according to claim 1, wherein the glass substrate comprises less than $1.6 \times 10^{12}$ atoms/cm² of Na, K, Fe, Cu and Zn within 5 nm of the at least one surface after step e).

11. The method according to claim 1, wherein the at least one surface of the glass substrate comprises less than 0.02 particles/cm² having an effective diameter greater than 0.3 microns after step e).

12. An in-line method of removing contaminants from a surface of a glass substrate comprising the steps of:
conveying the glass substrate with a conveying device along a conveyance direction, wherein during the conveying at least one surface of the glass substrate is subjected to a surface treatment comprising, sequentially:
a) exposing the at least one surface of the glass substrate to a liquid discharge comprising ozonated water;
b) exposing the at least one surface of the glass substrate to a liquid discharge of a first base solution;
c) exposing the at least one surface of the glass substrate to a liquid discharge of a second base solution;
d) exposing the at least one surface of the glass substrate to a liquid discharge of a first acid solution to remove metallic ions from the at least one surface of the glass substrate, wherein the first acid solution comprises HCl;
e) drying the at least one surface of the glass substrate; and
wherein an average surface roughness of the glass substrate is increased by exposing the glass substrate to a liquid discharge of a second acid solution.

13. The method according to claim 12, wherein exposing the glass substrate to a liquid discharge of a second acid solution is performed after step c).

14. The method according to claim 12, wherein exposing the glass substrate to a liquid discharge of a second acid solution is performed before step c).

15. The method according to claim 12, wherein the second acid solution comprises HF.

16. The method according to claim 12, wherein the second acid solution comprises an ammonium bifluoride solution having a molar concentration in a range from about 0.2 M to about 2 M.

17. The method according to claim 12, wherein the glass substrate comprises less than $1.6 \times 10^{12}$ atoms/cm² of Na, K, Fe, Cu and Zn within 10 nm of the at least one surface after step e).

18. The method according to claim 12, wherein the at least one surface of the glass substrate comprises less than 0.02 particles/cm² having an effective diameter greater than 0.3 microns after step e).

19. The method according to claim 12, further comprising applying ultrasonic energy to the first base solution at a frequency in a range from about 20 kHz to about 200 kHz.

20. The method according to claim 12, further comprising applying megasonic energy to the second base solution at a frequency in a range from about 850 kHz to about 1.2 MHz.

* * * * *